US012658901B2

(12) United States Patent
Huang et al.

(10) Patent No.:  US 12,658,901 B2
(45) Date of Patent:  Jun. 16, 2026

(54) DEVICE AND METHOD FOR SYNCHRONIZING A DATA INPUT SIGNAL AND A CLOCK INPUT SIGNAL

(71) Applicant: Taiwan Semiconductor Manufacturing Company, Ltd., Hsinchu (TW)

(72) Inventors: Yu-Jie Huang, Hsinchu (TW); Mu-Shan Lin, Hsinchu (TW); Hsin-Hung Kuo, Hsinchu (TW); Chien-Chun Tsai, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 117 days.

(21) Appl. No.: 18/641,604

(22) Filed: Apr. 22, 2024

(65) Prior Publication Data

US 2025/0330162 A1     Oct. 23, 2025

(51) Int. Cl.
| | |
|---|---|
| *H03K 5/14* | (2014.01) |
| *H03L 7/00* | (2006.01) |
| *H03K 5/00* | (2006.01) |

(52) U.S. Cl.
CPC ................. *H03K 5/14* (2013.01); *H03L 7/00* (2013.01); *H03K 2005/00058* (2013.01); *H03K 2005/00084* (2013.01); *H03K 2005/00286* (2013.01)

(58) Field of Classification Search
CPC ... G01S 7/28; G01S 13/10; G06F 1/12; G06F 11/00; G11B 20/20; H03K 1/134; H03K 5/14; H03K 5/19; H03K 5/22; H03K 5/24; H03K 5/153; H03K 5/156; H03L 7/00; H04L 7/00; H04L 7/02; H04L 7/04

USPC .................. 327/175; 375/219, 354; 713/401; 714/700
See application file for complete search history.

(56) References Cited

U.S. PATENT DOCUMENTS

| | | | | |
|---|---|---|---|---|
| 8,487,671 B2* | 7/2013 | Miyano | ..................... | G06F 1/04 |
| | | | | 375/373 |
| 10,236,042 B2 | 3/2019 | Eaton et al. | | |
| 11,082,035 B1 | 8/2021 | Hsieh et al. | | |
| 2005/0138457 A1* | 6/2005 | Gomm | ................... | G11C 7/222 |
| | | | | 713/401 |
| 2007/0296477 A1* | 12/2007 | White | ................... | H03K 5/133 |
| | | | | 327/175 |

(Continued)

FOREIGN PATENT DOCUMENTS

| | | |
|---|---|---|
| CN | 101770815 A | 7/2010 |
| TW | I685203 B | 2/2020 |
| TW | 202145712 A | 12/2021 |

*Primary Examiner* — Shawkat M Ali
(74) *Attorney, Agent, or Firm* — Jones Day

(57) ABSTRACT

A device includes a receiving circuit, a processing circuit, and a transmitting circuit. The receiving circuit generates a clock input signal and includes a plurality of receivers, each of which receives a data input signal and generates a first data output signal. Each receiver includes a delay line that is devoid of a duty cycle corrector (DCC), that has a predetermined number of delay elements, and that introduces a propagation delay to the data input signal by a fixed amount that substantially matches a propagation delay of the clock input signal. The processing circuit processes the first data output signal and generates a second data output signal. The transmitting circuit transmits the second data output signal to a data signal-receiving device.

20 Claims, 13 Drawing Sheets

(56)             References Cited

U.S. PATENT DOCUMENTS

| | | | |
|---|---|---|---|
| 2010/0153792 A1 | 6/2010 | Jang | |
| 2018/0041328 A1* | 2/2018 | Patil | G06F 1/04 |
| 2018/0164419 A1* | 6/2018 | Ärlelid | G01S 13/103 |
| 2023/0386600 A1* | 11/2023 | Lee | G11C 29/52 |

* cited by examiner

300

310 receive a clock input signal 320 receive a data input signal 330 introduce a propagation delay to the data input signal by a fixed amount 340 generate a control input signal 350 fine tune the propagation delay by an amount that varies with the control input signal 360 generate a data output signal 370 process the data output signal 380 transmit the data output signal

500

510 — receive a clock input signal

520 — receive a data input signal

530 — introduce a propagation delay to the data input signal by a predetermined amount 540 — generate a data output signal 550 — process the data output signal 560 — transmit the data output signal

1100

1110 receive a clock input signal 1120 receive a data input signal 1130 introduce a propagation delay to the data input signal by an amount that varies with a control input signal 1140 generate a data output signal 1150 process the data output signal 1160 transmit the data output signal

DEVICE AND METHOD FOR SYNCHRONIZING A DATA INPUT SIGNAL AND A CLOCK INPUT SIGNAL

BACKGROUND

Devices are often configured to receive a data input signal from a data signal-generating device along with a clock input signal from a clock signal-generating device, process the data input signal to generate a data output signal, and transmit the data output signal to a data signal-receiving device. Synchronization within the device is often important to proper performance of such devices.

BRIEF DESCRIPTION OF THE DRAWINGS

Aspects of the present disclosure are best understood from the following detailed description when read with the accompanying figures.

DETAILED DESCRIPTION

Figure 1A:
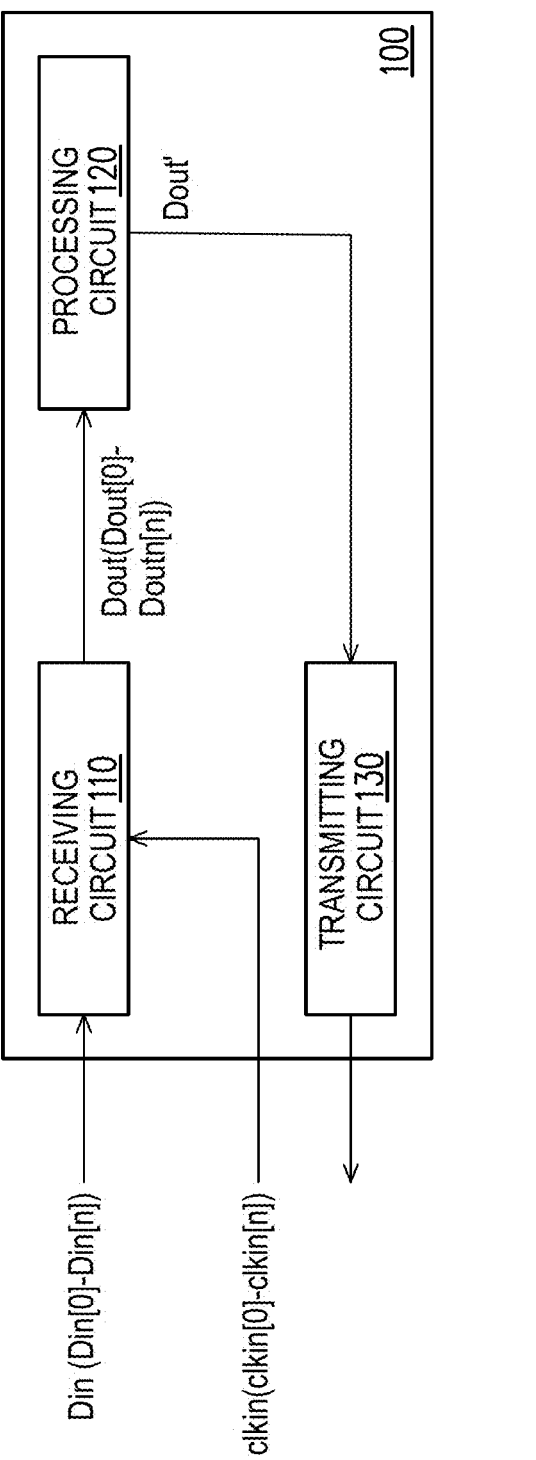
FIG. 1A is a block diagram of an exemplary embodiment of a device in accordance with an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A device includes a receiving circuit that receives a data input signal and a clock input signal. In one embodiment, the receiving circuit generates, as a data output signal, high and low portions of the data input signal on rising and falling edges of the clock input signal. In some implementations, the alignment between the high and low portions of the data input signal and the rising and falling edges of the clock input signal undesirably occurs after a significant synchronization delay. Specifically, the receiving circuit receives the data input signal such that the clock input signal is in its inactive (or low) state or the rising (or falling) edges of the clock input signal are aligned with the transition (rising or falling) edges of the data input signal. Accordingly, the high and low portions of the data input signal are gradually aligned or synchronized with the rising and falling edges of the clock input signal. This delayed alignment or synchronization results in the inaccurate subsequent operation of processing the data output signal.

The approaches of the present disclosure provide devices and methods for aligning high and low portions of a data input signal to rising and falling edges of a clock input signal without a significant synchronization delay, e.g., between about 0.2 ps and about 1.2 ps. For example, devices and methods herein may ensure that the alignment or synchronization between the high and low portions of the data input signal and the rising and falling edges of the clock input signal starts promptly after receiving the data input signal, i.e., from the first high or low portion of the data input signal.

In certain exemplary embodiments, devices and methods include a receiving circuit, e.g., receiving circuit 110 of FIG. 1A, that receives a data input signal (Din) and a clock input signal (clkin) and that generates, as a data output signal (Dout), the high and low portions of the data input signal (Din) during the rising and falling edges of the clock input signal (clkin). The receiving circuit 110 facilitates alignment between the high and low portions of the data input signal (Din) and the rising and falling edges of the clock input signal (clkin) without a significant synchronization delay. For example, the receiving circuit 110 includes a delay circuit, e.g., delay circuit 270 of FIG. 2A, which introduces a propagation delay to the data input signal (Din) that substantially matches the propagation delay of the clock input signal (clkin), in a manner that will be described hereinafter.

Figure 1B:
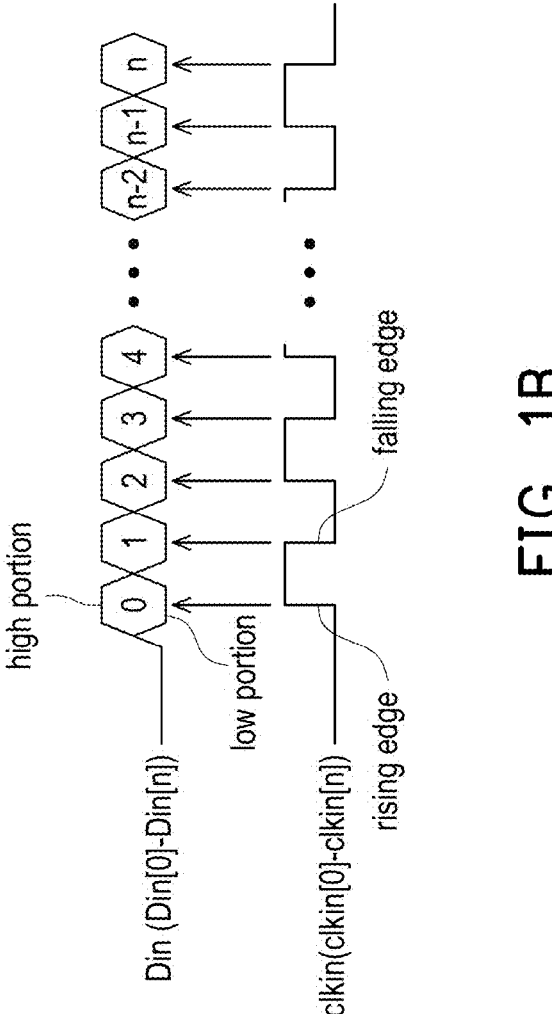
FIG. 1B is a timing diagram illustrating an exemplary embodiment of a relationship between a data input signal and a clock input signal in accordance with an embodiment of the present disclosure.

FIG. 1A is a block diagram of an exemplary embodiment of a device 100 in accordance with the present disclosure. FIG. 1B is a timing diagram illustrating an exemplary embodiment of a relationship between the data input signal (Din) and the clock input signal (clkin) in accordance with an embodiment of the present disclosure. As illustrated in FIG. 1A, the device 100 includes a receiving circuit 110, a processing circuit 120, and a transmitting circuit 130. The receiving circuit 110 receives a data input signal (Din), which includes a plurality of data input signals (Din[0]-Din [n]) that are received, e.g., from a data signal-generating device external to the device 100. Concurrently, the receiving circuit 110 receives a clock input signal (clkin), which includes a plurality of clock input signals (clkin[0]-clkin[n]) that are received, e.g., from a clock signal-generating device external to the device 100. To ensure synchronization, the receiving circuit 110 substantially matches the propagation delay of the data input signal (Din) to the propagation delay of the clock input signal (clkin). Subsequently, the receiving circuit 110 generates, as a data output signal (Dout), the high and low portions of the data input signal (Din) at the rising and falling edges of the clock input signal (clkin). Because the propagation delay of the data input signal (Din) is substantially matched with the propagation delay of the clock input signal (clkin), with further reference to FIG. 1B, the receiving circuit 110 aligns the high and low portions of the data input signal (Din) with the rising and falling edges of the clock input signal (clkin) without a significant synchronization delay. That is, the alignment or synchronization between the high and low portions of the data input signal (Din) and the rising and falling edges of the clock input signal (clkin) commences instantly following the receiving circuit 110 receiving the data input signal (Din), i.e., from the first high or low portion of the data input signal (Din). The processing circuit 120 processes the data output signal (Dout) and generates a data output signal (Dout'). The transmitting circuit 130 transmits the data output signal (Dout') to, e.g., a data signal-receiving device external to the device 100.

In an alternative embodiment, the device 100 is dispensed with at least one of the processing circuit 120 and the transmitting circuit 130. In such an alternative embodiment, the at least one of the processing circuit 120 and the transmitting circuit 130 are external to the device 100.

The circuits illustrated in FIG. 1A may take a variety of forms. For example, in certain exemplary embodiments, the receiving circuit 110 is compliant with a specification for a die-to-die interconnect (and a serial bus) between chiplets, e.g., Universal Chiplet Interconnection Express (UCIE) standard. Examples of processing circuits 120 include microprocessors, graphics processing units (GPUs), digital signal processors (DSPs), memory devices (RAMs and ROMs), and application-specific integrated circuits (ASICs).

Figure 2A:
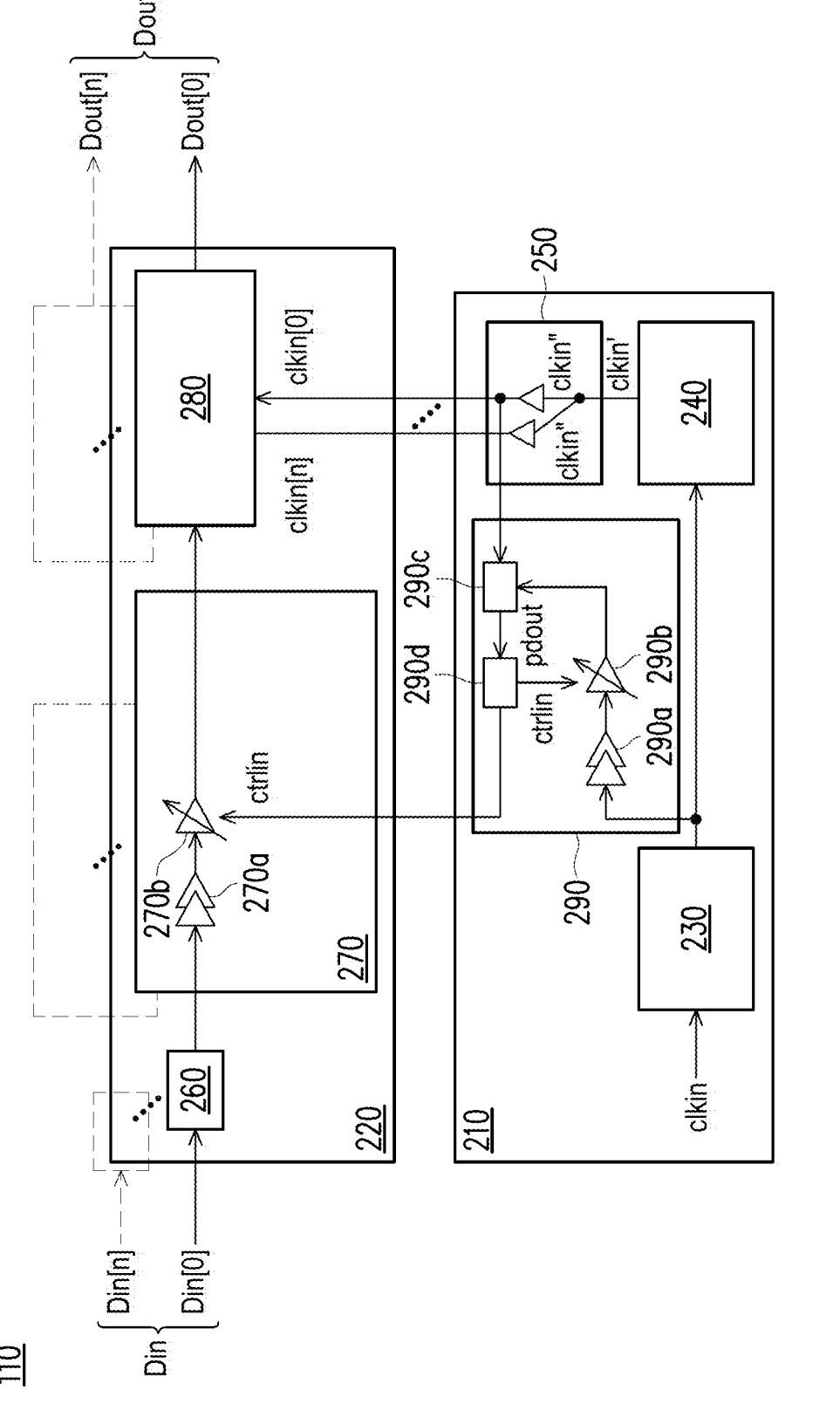
FIG. 2A is a block diagram of the first exemplary embodiment of a receiving circuit of the device in accordance with an embodiment of the present disclosure.

FIG. 2A is a block diagram of an embodiment of a receiving circuit 110 of the device 100 in accordance with the present disclosure. As illustrated in FIG. 2A, the receiving circuit 110 includes a clock tree 210 and a plurality of receivers 220. In an alternative embodiment, the receiving circuit 110 is dispensed with the clock tree 210. The clock tree 210 includes an amplifier 230, a calibration circuit 240, a distribution network 250, and a control signal-generating circuit 290. The amplifier 230 receives the clock input signal (clkin), e.g., from a clock signal-generating device external to the device 100, and generates an amplified version of the clock input signal (clkin).

The calibration circuit 240 adjusts the amplified version of the clock input signal (clkin) and generates a clock input signal (clkin'). For example, the calibration circuit 240 may include a duty cycle corrector (DCC) that corrects the duty cycle of the amplified version of the clock input signal (clkin) and generates a clock input signal (clkin') that has a substantially 50% duty cycle.

The distribution network 250 includes a trunk, a plurality of branches, a plurality of clock tree leaves, and a plurality of buffers. The trunk receives the clock input signal (clkin'). The branches extend from the trunk and generate a plurality of clock input signals (clkin") based on the clock input signal (clkin'). The clock tree leaves generate a plurality of clock input signals (clkin[0]-clkin[n]). Each of the buffers is connected between the respective one of the branches and the respective one of the clock tree leaves and amplifies the respective one of the clock input signals (clkin"). Each amplified clock input signal (clkin") serves as the respective clock input signal (clkin[0]-clkin[n]).

In an alternative embodiment, the calibration circuit 240 generates a pair of clock input signals (clkin'). In such an alternative embodiment, the calibration circuit 240 includes a phase error corrector, e.g., a quadrature error corrector (QEC), that corrects a phase error between the pair of clock input signals (clkin').

Figure 2B:
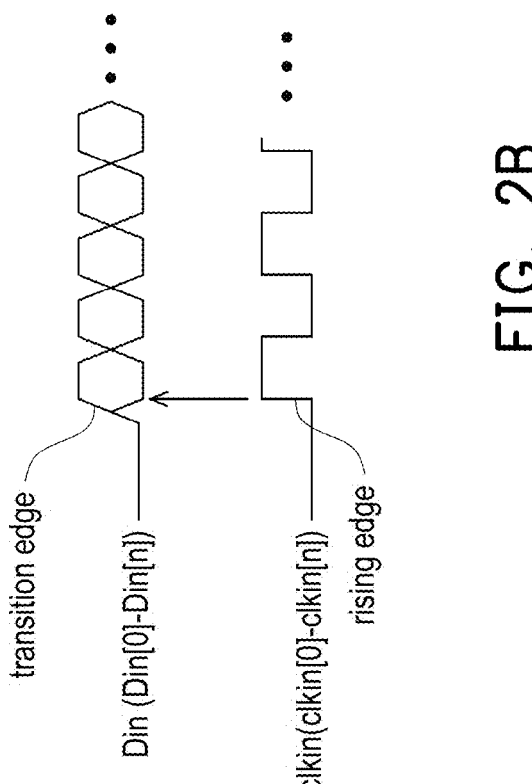
FIG. 2B is another timing diagram illustrating an exemplary embodiment of a relationship between a data input signal and a clock input signal in accordance with an embodiment of the present disclosure.

With further reference to FIG. 2B, which is another timing diagram illustrating an exemplary embodiment of a relationship between a data input signal and a clock input signal in accordance with an embodiment of the present disclosure, the control signal-generating circuit 290 aligns or synchronizes the rising edge of the clock input signal (clkin) to the transition (rising or falling) edge of the data input signal (Din). For example, as also illustrated in FIG. 2A, the control signal-generating circuit 290 includes first and second delay lines 290a, 290b, a phase detector 290c, and a controller 290d. The first delay line 290a introduces a propagation delay to the amplified version of the clock input signal (clkin) by a fixed amount. In some embodiments, the first delay line 290a includes a predetermined number of delay elements (such as buffers and inverters). In such some embodiments, the first delay lines 290a of at least two of the receivers 220 have the same number of delay elements. In other embodiments, the first delay lines 290a of at least two of the receivers 220 have different numbers of delay elements.

The second delay line 290b mitigates concerns associated with process, voltage and temperature (PVT) corners. For example, the second delay line 290b fine tunes the propagation delay of the first delay line 290a. In this exemplary embodiment, the second delay line 290b receives a control input signal (ctrlin) and introduces a propagation delay by an amount that varies with the control input signal (ctrlin). In certain embodiments, the second delay line 290b includes a digitally-controlled delay line (DCDL).

The phase detector 290c is connected between a clock tree leaf of the distribution network 250 and the output of the second delay line 290b, compares the phase of the amplified version of the clock input signal (clkin) and the phase of the amplified version of the clock input signal (clkin"), and generates a phase difference (pdout) based on the result of the comparison. The controller 290d is connected to the phase detector 290c and generates the control input signal (ctrlin) based on the phase difference (pdout). For example, the controller 290d includes a finite state machine (FSM). Systems and methods herein contemplate various other configurations for the clock tree 210. For example, in an alternative embodiment, the clock tree 210 is dispensed with at least one of the amplifier 230, the calibration circuit 240, the distribution network, and the control signal-generating circuit 290.

As also illustrated in FIG. 2A, each of the receivers 220 receives the respective one of the data input signals (Din [0]-Din[n]), e.g., from a data signal-generating device external to the device 100, and the respective one of clock input signals (clkin[0]-clkin[n]), from the clock tree 210, and generates a plurality of data output signals (Dout[0]-Dout

[n]), each corresponding to the respective data input signal (Din[0]-Din[n]). Because the receivers 220 are identical or similar in construction and operation, only one of the receivers 220 will be described hereinbelow.

The receiver 220 includes an amplifier 260, a delay circuit 270, and a data input/output (I/O) circuit 280. The amplifier 260 receives a data input signal (Din[0]) and generates an amplified version of the data input signal (Din[0]).

The delay circuit 270 substantially matches the propagation delay of the data input signal (Din[0]) to the propagation delay of the clock input signal (clkin[0]). For example, the delay circuit 270 includes first and second delay lines 270a, 270b. The first delay line 270a introduces a propagation delay to the amplified version of the data input signal (Din[0]) by a fixed amount. In some embodiments, the first delay line 270a includes a predetermined number of delay elements (such as buffers and inverters). In such some embodiments, the first delay lines 270a of at least two of the receivers 220 have the same number of delay elements. In other embodiments, the first delay lines 270a of at least two of the receivers 220 have different numbers of delay elements.

The second delay line 270b mitigates concerns associated with PVT corners. For example, the second delay line 270b fine tunes the propagation delay of the first delay line 270a. In this exemplary embodiment, the second delay line 270b receives the control input signal (ctrlin) and introduces a propagation delay by an amount that varies with the control input signal (ctrlin). In certain embodiments, the second delay line 270b includes a DCDL.

The data I/O circuit 280 receives the amplified version of the data input signal (Din[0]) and the clock input signal (clkin[0]) and generates, as a data output signal (Dout[0]), the high and low portions of the data input signal (Din[0]) on the rising and falling edges of the clock input signal (clkin[0]). By virtue of the delay circuit 270, which substantially matches the propagation delay of the data input signal (Din[0]) with the propagation delay of the clock input signal (clkin[0]), the data I/O circuit 280 aligns the high and low portions of the data input signal (Din[0]) to the rising and falling edges of the clock input signal (clkin[0]) without a significant synchronization delay. That is, this alignment or synchronization begins immediately upon the data I/O circuit 280 receives the amplified version of the data input signal (Din[0]), i.e., from the first high or low portion of the data input signal (Din[0]).

In some embodiments, the data I/O circuit 280 includes a sense amplifier. In other embodiments, the data I/O circuit 280 includes a de-serializer. In such other embodiments, the data input signal (Din[0]) is in a serial form and the de-serializer converts the data input signal (Din[0]) into a parallel form.

The processing circuit 120 processes the data output signal (Dout[0]) and generates a data output signal (Dout'). The transmitting circuit 130 transmits the data output signal (Dout') to, e.g., a data signal-receiving device external to the device 100.

In an alternative embodiment, the receiver 220 is dispensed with at least one of the amplifier 260, the delay circuit 270, and the data I/O circuit 280.

Figure 3:
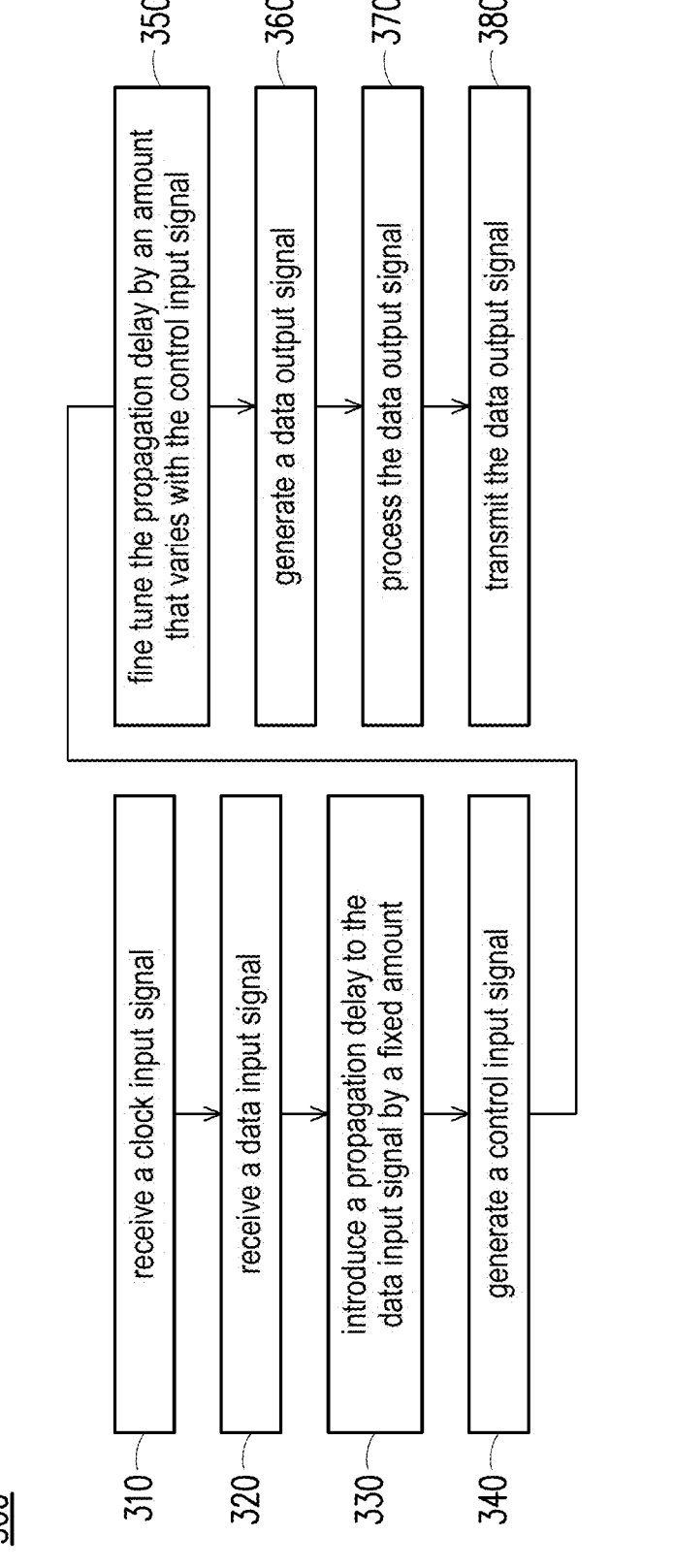
FIG. 3 is a flow chart of the first exemplary embodiment of a method for synchronizing a data input signal and a clock input signal in accordance with an embodiment of the present disclosure.

FIG. 3 is a flow chart of an embodiment of a method 300 for aligning or synchronizing low and high portions of a data input signal with rising and falling edges of a clock input signal in accordance with the present disclosure. The example method 300 is described with further reference to FIGS. 1A, 1B, 2A, and 2B for ease of understanding. It is understood that the method 300 is applicable to structures other than those of FIGS. 1A, 1B, 2A, and 2B. Further, it is understood that additional operations can be provided before, during, and after the method 300, and some of the operations described below can be replaced or eliminated, in an alternative embodiment of the method 300.

In operation 310, the clock tree 210 receives a clock input signal (clkin), e.g., from a clock signal-generating device external to the device 100, and generates a plurality of clock input signals (clkin[0]-clkin[n]). In this exemplary embodiment, the operation 310 includes: the amplifier 230 amplifying the clock input signal (clkin); the calibration circuit 240 adjusting the duty cycle of the amplified version of the clock input signal (clkin) and generating a clock input signal (clkin') that has a substantially 50% duty cycle; the distribution network 250 generating a plurality of clock input signals (clkin[0]-clkin[n]) based on the clock input signal (clkin'); and the control signal-generating circuit 290 aligning or synchronizing the rising edge of the clock input signal (clkin[0]) to the transition (rising or falling) edge of the data input signal (Din[0]). In an alternative embodiment, the operation 310 further includes the calibration circuit 240 minimizing or eliminating a phase error between a pair of clock input signals (clkin').

In operation 320, the amplifier 260 receives a data input signal (Din[0]), e.g., from a data signal-generating device external to the device 100, and generates an amplified version of the data input signal (Din[0]).

In operation 330, the first delay line 270a introduces a propagation delay to the amplified version of the data input signal (Din[0]) by a fixed or predetermined amount.

In operation 340, the control signal-generating circuit 290 generates a control input signal (ctrlin).

In operation 350, the second delay line 270b receives the control input signal (ctrlin) and fine tunes the propagation delay of the first delay line 270a by an amount that varies with the control input signal (ctrlin).

In operation 360, the data I/O circuit 280 receives the amplified version of the data input signal (Din[0]) and the clock input signal (clkin[0]) and generates, as a data output signal (Dout[0]), the high and low portions of the amplified data input signal (Din[0]) during the rising and falling edges of the clock input signal (clkin[0]). By virtue of the delay circuit 270, which substantially matches the propagation delay of the data input signal (Din[0]) to the propagation delay of the clock input signal (clkin[0]), the data I/O circuit 280 aligns the high and low portions of the data input signal (Din[0]) to the rising and falling edges of the clock input signal (clkin[0]) without a significant synchronization delay. That is, the data I/O circuit 280 generates the data output signal (Dout) such that the alignment or synchronization between the high and low portions of the data input signal (Din[0]) and the rising and falling edges of the clock input signal (clkin[0]) occurs at once when the data I/O circuit 280 receives the data input signal (Din[0]), i.e., from the first high or low portion of the data input signal (Din[0]).

In operation 370, the processing circuit 120 processes the data output signal (Dout[0]) and generates a data output signal (Dout'). In operation 380, the transmitting circuit 130 transmits the data output signal (Dout') to, e.g., a data signal-receiving device external to the device 100.

Figure 4:
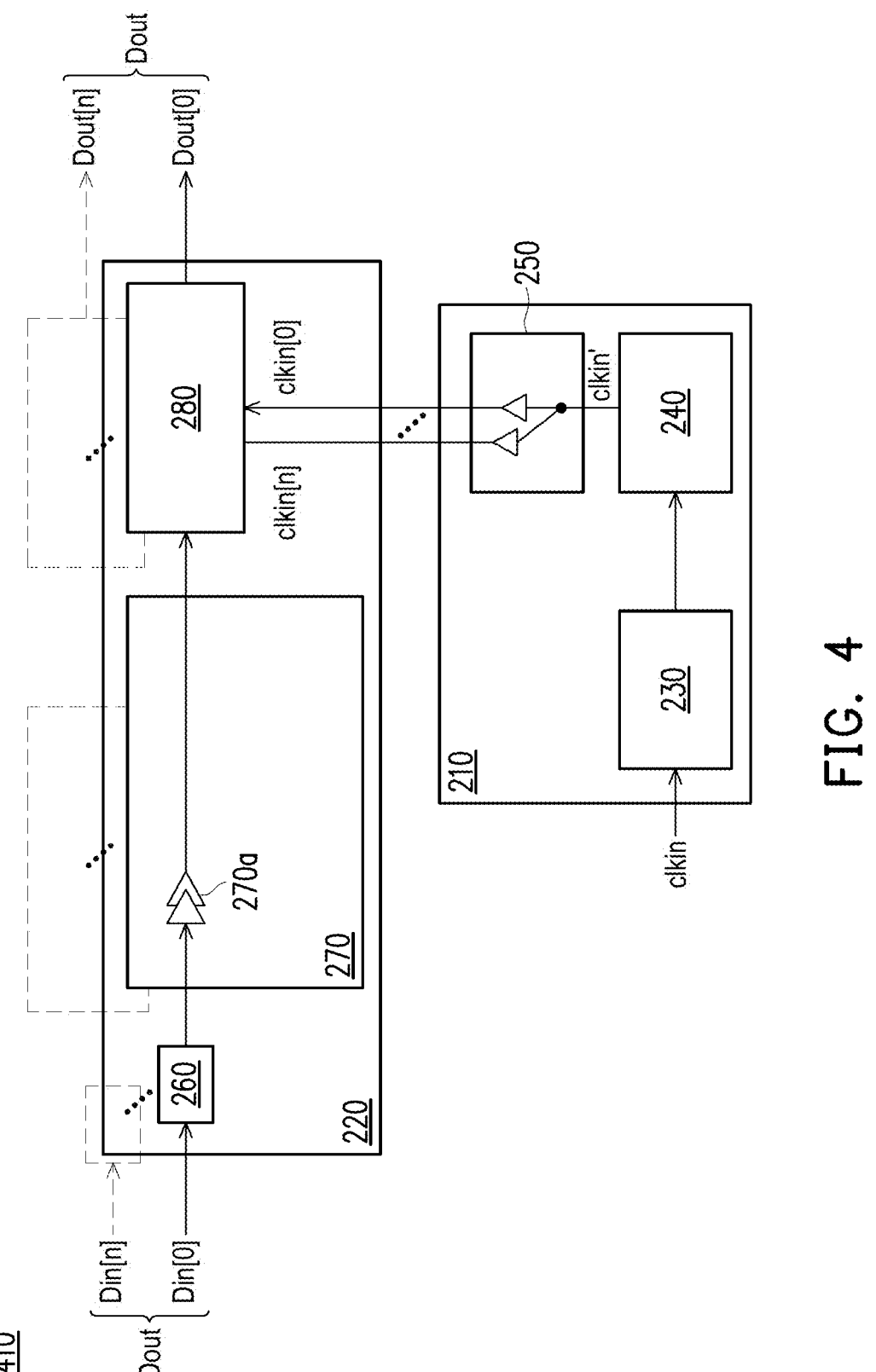
FIG. 4 is a block diagram of the second exemplary embodiment of a receiving circuit of the device in accordance with an embodiment of the present disclosure.

FIG. 4 is a block diagram of a further exemplary embodiment of a receiving circuit 410 of the device 100 in accordance with the present disclosure. As illustrated in FIG. 4, the example receiving circuit 410 differs from the example receiving circuit 110 of FIG. 2A in that the delay circuit 270 of at least one of the receivers 220 of the receiving circuit 410 is implemented with the first delay line 270a and is dispensed with the second delay line 270b. The clock tree 210 is dispensed with the control signal-generating circuit 290. In this exemplary embodiment, like the receiving circuit 110, the first delay line 270a of the receiving circuit 410 introduces a fixed or predetermined amount of a propagation delay to the amplified version of the data input signal (Din[0]). However, unlike the receiving circuit 110, the receiving circuit 410 does not fine tune the propagation delay of the first delay line 270a.

In some embodiments, the first delay line 270a includes a predetermined number of delay elements (such as buffers and inverters). In such some embodiments, the first delay lines 270a of at least two of the receivers 220 have different numbers of delay elements. In other embodiments, the first delay lines 270a of at least two of the receivers 220 have the same number of delay elements.

Figure 5:
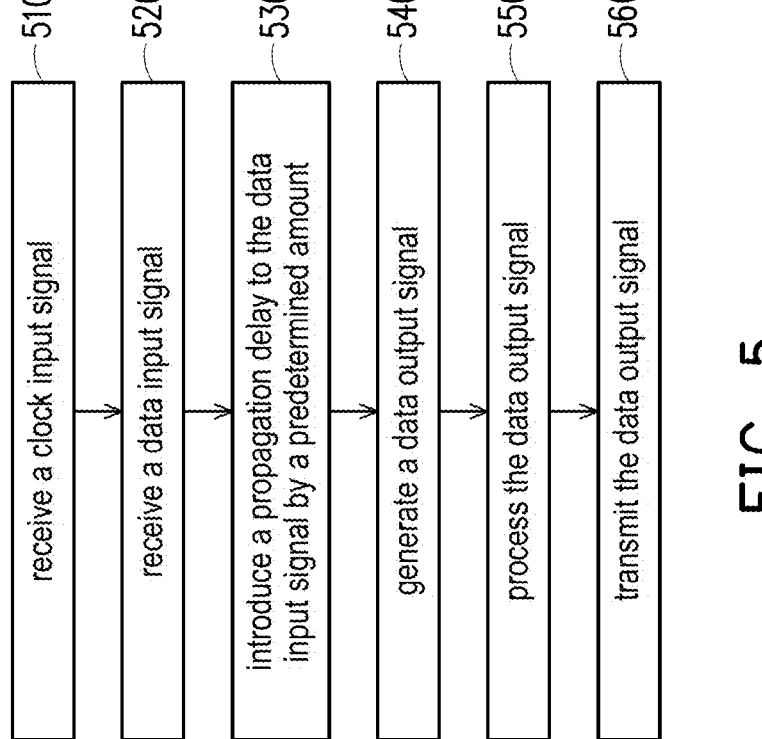
FIG. 5 is a flow chart of the second exemplary embodiment of a method for synchronizing a data input signal and a clock input signal in accordance with an embodiment of the present disclosure.

FIG. 5 is a flow chart of a further exemplary embodiment of a method 500 for aligning or synchronizing low and high portions of a data input signal to rising and falling edges of a clock input signal in accordance with the present disclosure. The example method 500 is described with further reference to FIGS. 1A, 1B, 2B, and 4 for ease of understanding. It is understood that the method 500 is applicable to structures other than those of FIGS. 1A, 1B, 2B, and 4. Further, it is understood that additional operations can be provided before, during, and after the method 500, and some of the operations described below can be replaced or eliminated, in an alternative embodiment of the method 500.

In operation 510, the clock tree 210 receives a clock input signal (clkin), e.g., from a clock signal-generating device external to the device 100, and generates a plurality of clock input signals (clkin[0]-clkin[n]). In this exemplary embodiment, the operation 510 includes: the amplifier 230 amplifying the clock input signal (clkin); the calibration circuit 240 adjusting the duty cycle of the amplified version of the clock input signal (clkin) and generating a clock input signal (clkin') that has a substantially 50% duty cycle; and the distribution network 250 generating a plurality of clock input signals (clkin[0]-clkin[n]) based on the clock input signal (clkin'). In an alternative embodiment, the operation 510 further includes the calibration circuit 240 minimizing or eliminating a phase error between a pair of clock input signals (clkin').

In operation 520, the amplifier 260 receives a data input signal (Din[0]), e.g., from a data signal-generating device external to the device 100, and generates an amplified version of the data input signal (Din[0]).

In operation 530, the first delay line 270a introduces a propagation delay to the amplified version of the data input signal (Din[0]) by a fixed or predetermined amount.

In operation 540, the data I/O circuit 280 receives the amplified version of the data input signal (Din[0]) and the clock input signal (clkin[0]) and generates, as a data output signal (Dout[0]), the high and low portions of the amplified data input signal (Din[0]) at the rising and falling edges of the clock input signal (clkin[0]). By virtue of the delay circuit 270, which substantially matches the propagation delay of the data input signal (Din[0]) with the propagation delay of the clock input signal (clkin[0]), the data I/O circuit 280 aligns the high and low portions of the data input signal (Din[0]) to the rising and falling edges of the clock input signal (clkin[0]) without a significant synchronization delay. That is, the data I/O circuit 280 generates the data output signal (Dout) such that the alignment or synchronization between the high and low portions of the data input signal (Din[0]) and the rising and falling edges of the clock input signal occurs at once when the data I/O circuit 280 receives the data input signal (Din[0]), i.e., from the first high or low portion of the data input signal (Din[0]).

In operation 550, the processing circuit 120 processes the data output signal (Dout[0]) and generates a data output signal (Dout'). In operation 560, the transmitting circuit 130 transmits the data output signal (Dout') to, e.g., a data signal-receiving device external to the device 100.

Figure 6:
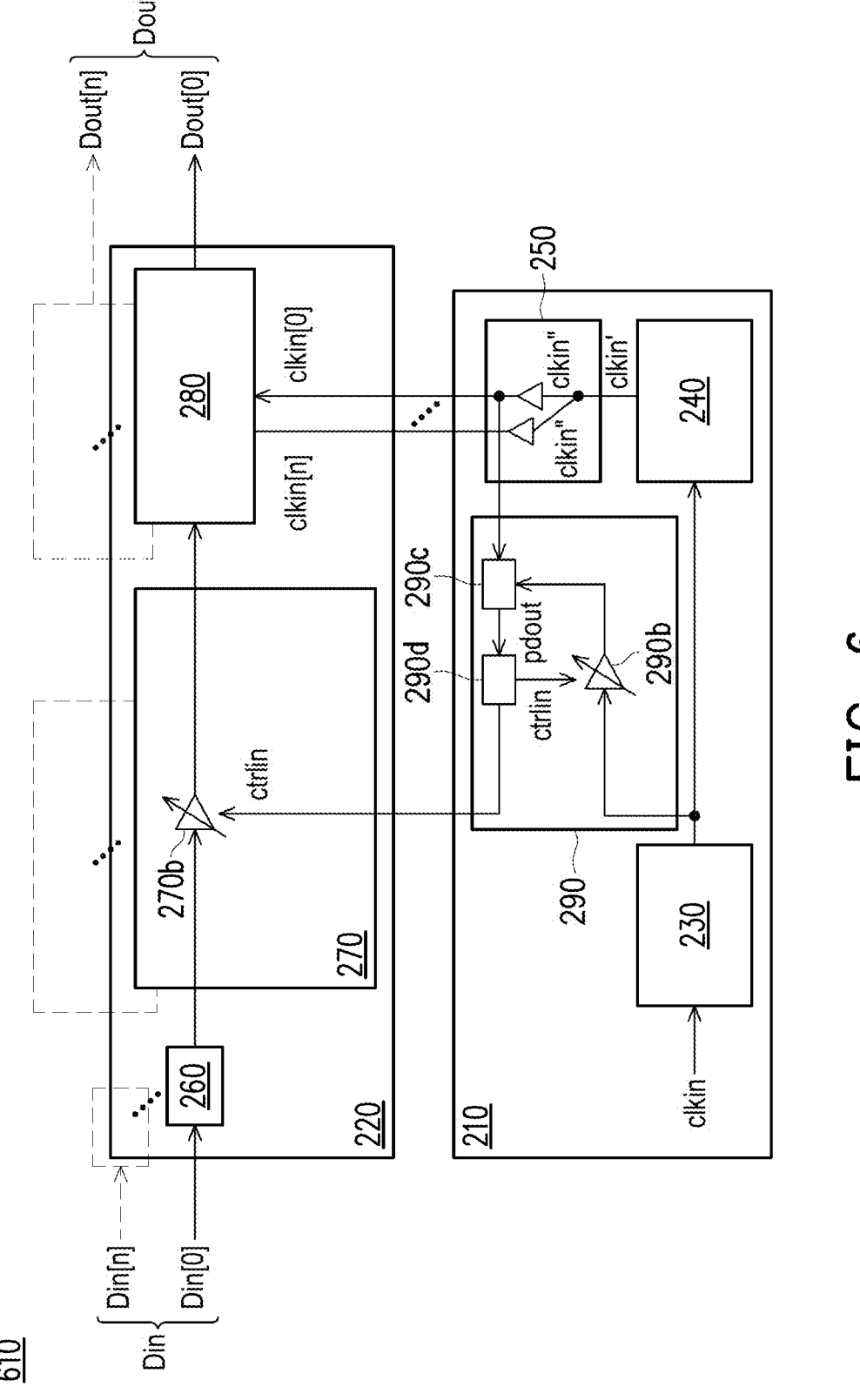
FIG. 6 is a block diagram of the third exemplary embodiment of a receiving circuit of the device in accordance with an embodiment of the present disclosure.

FIG. 6 is a block diagram of a further exemplary embodiment of a receiving circuit 610 of the device 100 in accordance with the present disclosure. As illustrated in FIG. 6, the example receiving circuit 610 differs from the example receiving circuit 110 of FIG. 2A in that the delay circuit 270 of at least one of the receivers 220 of the receiving circuit 610 is implemented with the second delay line 270b and is dispensed with the first delay line 270a. In this exemplary embodiment, the second delay line 270b of the receiving circuit 610 introduces a propagation delay to the amplified version of the data input signal (Din[0]) by an amount that varies with the control input signal (ctrlin). Unlike the receiving circuit 110, the receiving circuit 610 does not introduce a fixed or predetermined amount of a propagation delay to the amplified version of the data input signal (Din[0]).

Figure 7:
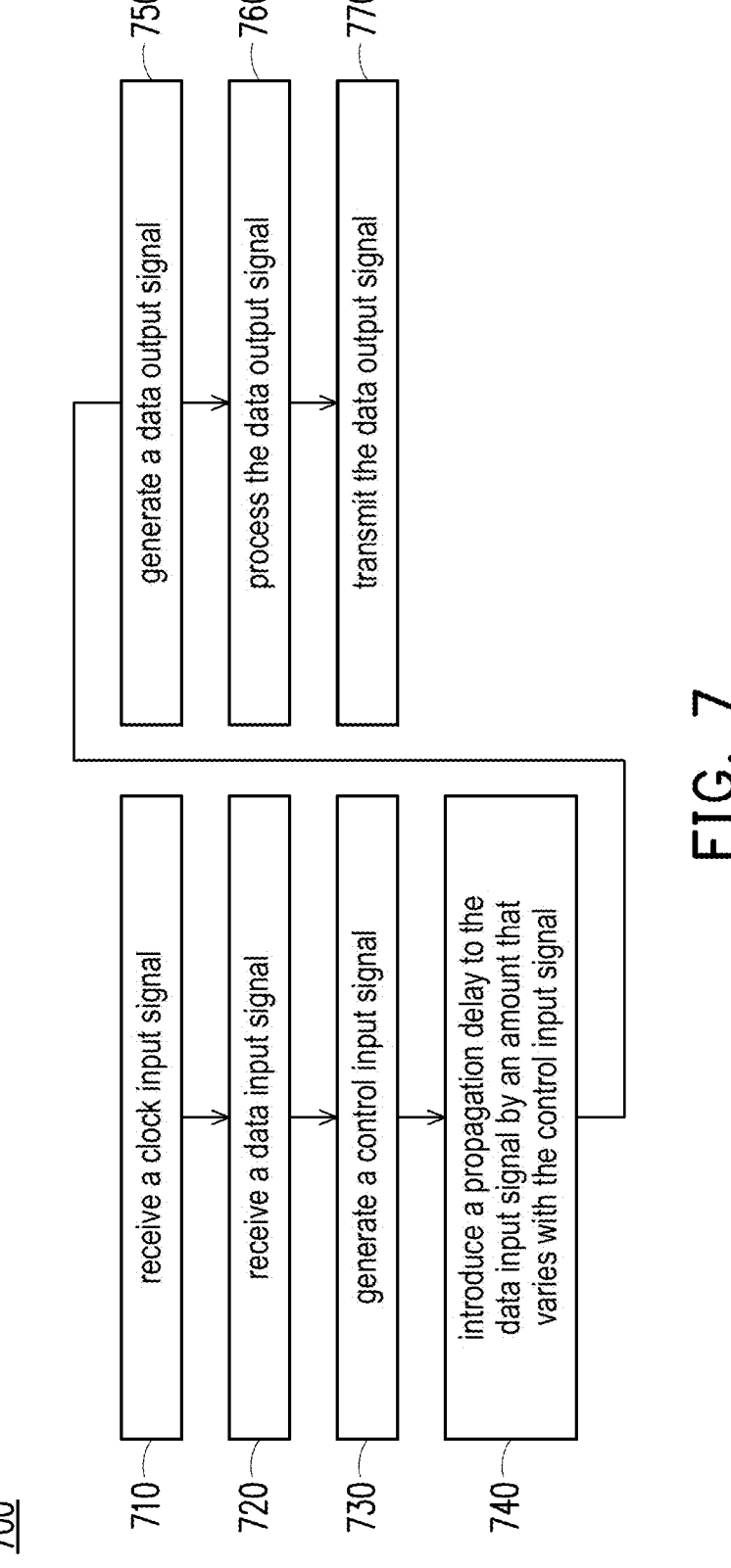
FIG. 7 is a flow chart of the third exemplary embodiment of a method for synchronizing a data input signal and a clock input signal in accordance with an embodiment of the present disclosure.

FIG. 7 is a flow chart of a further exemplary embodiment of a method 700 for aligning or synchronizing low and high portions of a data input signal with rising and falling edges of a clock input signal in accordance with the present disclosure. The example method 700 is described with further reference to FIGS. 1A, 1B, 2B, and 6 for ease of understanding. It is understood that the method 700 is applicable to structures other than those of FIGS. 1A, 1B, 2B, and 6. Further, it is understood that additional operations can be provided before, during, and after the method 700, and some of the operations described below can be replaced or eliminated, in an alternative embodiment of the method 700.

In operation 710, the clock tree 210 receives a clock input signal (clkin), e.g., from a clock signal-generating device external to the device 100, and generates a plurality of clock input signals (clkin[0]-clkin[n]). In this exemplary embodiment, the operation 710 includes: the amplifier 230 amplifying the clock input signal (clkin); the calibration circuit 240 adjusting the duty cycle of the amplified version of the clock input signal (clkin) and generating a clock input signal (clkin') that has a substantially 50% duty cycle; the distribution network 250 generating a plurality of clock input signals (clkin[0]-clkin[n]) based on the clock input signal (clkin'); and the control signal-generating circuit 290 aligning or synchronizing the rising edge of the clock input signal (clkin[0]) to the transition (rising or falling) edge of the data input signal (Din[0]). In an alternative embodiment, the operation 710 further includes the calibration circuit 240 minimizing or eliminating a phase error between a pair of clock input signals (clkin').

In operation 720, the amplifier 260 receives a data input signal (Din[0]), e.g., from a data signal-generating device external to the device 100, and generates an amplified version of the data input signal (Din[0]).

In operation 730, the control signal-generating circuit 290 generates a control input signal (ctrlin).

In operation 740, the second delay line 270b receives the control input signal (ctrlin) and introduces a propagation delay to the amplified version of the data input signal (Din[0]) by an amount that varies with the control input signal (ctrlin).

In operation 750, the data I/O circuit 280 receives the amplified version of the data input signal (Din[0]) and the clock input signal (clkin[0]) and generates, as a data output signal (Dout[0]), the high and low portions of the amplified data input signal (Din[0]) on the rising and falling edges of the clock input signal (clkin[0]). By virtue of the delay circuit 270, which substantially matches the propagation delay of the data input signal (Din[0]) to the propagation delay of the clock input signal (clkin[0]), the data I/O circuit 280 aligns the high and low portions of the data input signal (Din[0]) with the rising and falling edges of the clock input signal (clkin[0]) without a significant synchronization delay. That is, the data I/O circuit 280 generates the data output signal (Dout) such that the alignment or synchronization between the high and low portions of the data input signal (Din[0]) and the rising and falling edges of the clock input signal occurs at once when the data I/O circuit 280 receives the data input signal (Din[0]), i.e., from the first high or low portion of the data input signal (Din[0]).

In operation 760, the processing circuit 120 processes the data output signal (Dout[0]) and generates a data output signal (Dout'). In operation 770, the transmitting circuit 130 transmits the data output signal (Dout') to, e.g., a data signal-receiving device external to the device 100.

Figure 8:
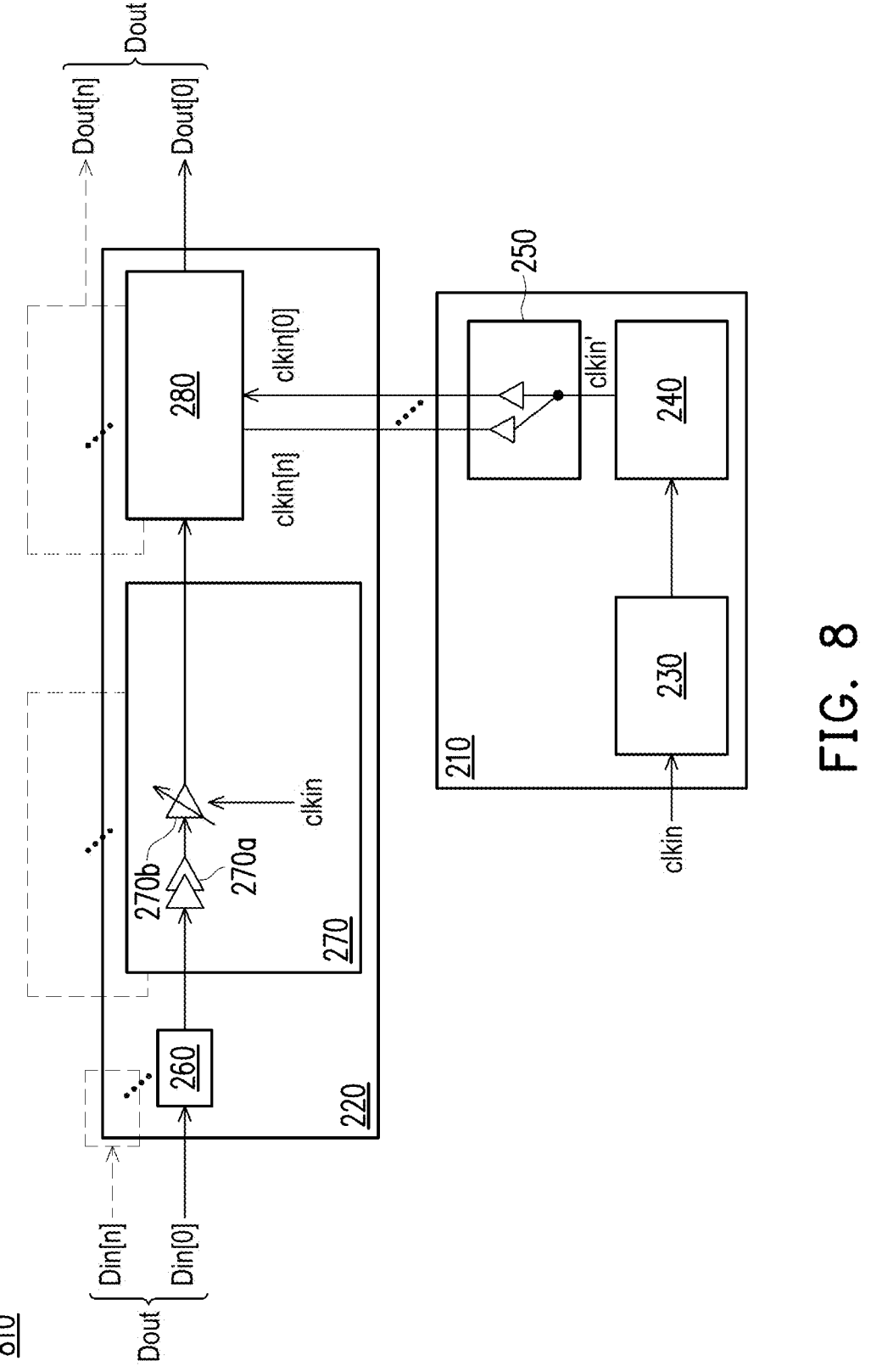
FIG. 8 is a block diagram of the fourth exemplary embodiment of a receiving circuit of the device in accordance with an embodiment of the present disclosure.

FIG. 8 is a block diagram of a further exemplary embodiment of a receiving circuit 810 of the device 100 in accordance with the present disclosure. As illustrated in FIG. 8, the example receiving circuit 810 differs from the example receiving circuit 110 of FIG. 2A in that the clock tree 210 is dispensed with the control signal-generating circuit 290. In this exemplary embodiment, like the receiving circuit 110, the receiving circuit 810 introduces a fixed or predetermined amount of a propagation delay to the amplified version of the data input signal (Din[0]) and fine tunes the propagation delay of the first delay line 270a by an amount that varies with the control input signal (ctrlin). Unlike the receiving circuit 110, the receiving circuit 810 receives the control input signal (ctrlin) from a control signal-generating device external to the device 100.

Figure 9:
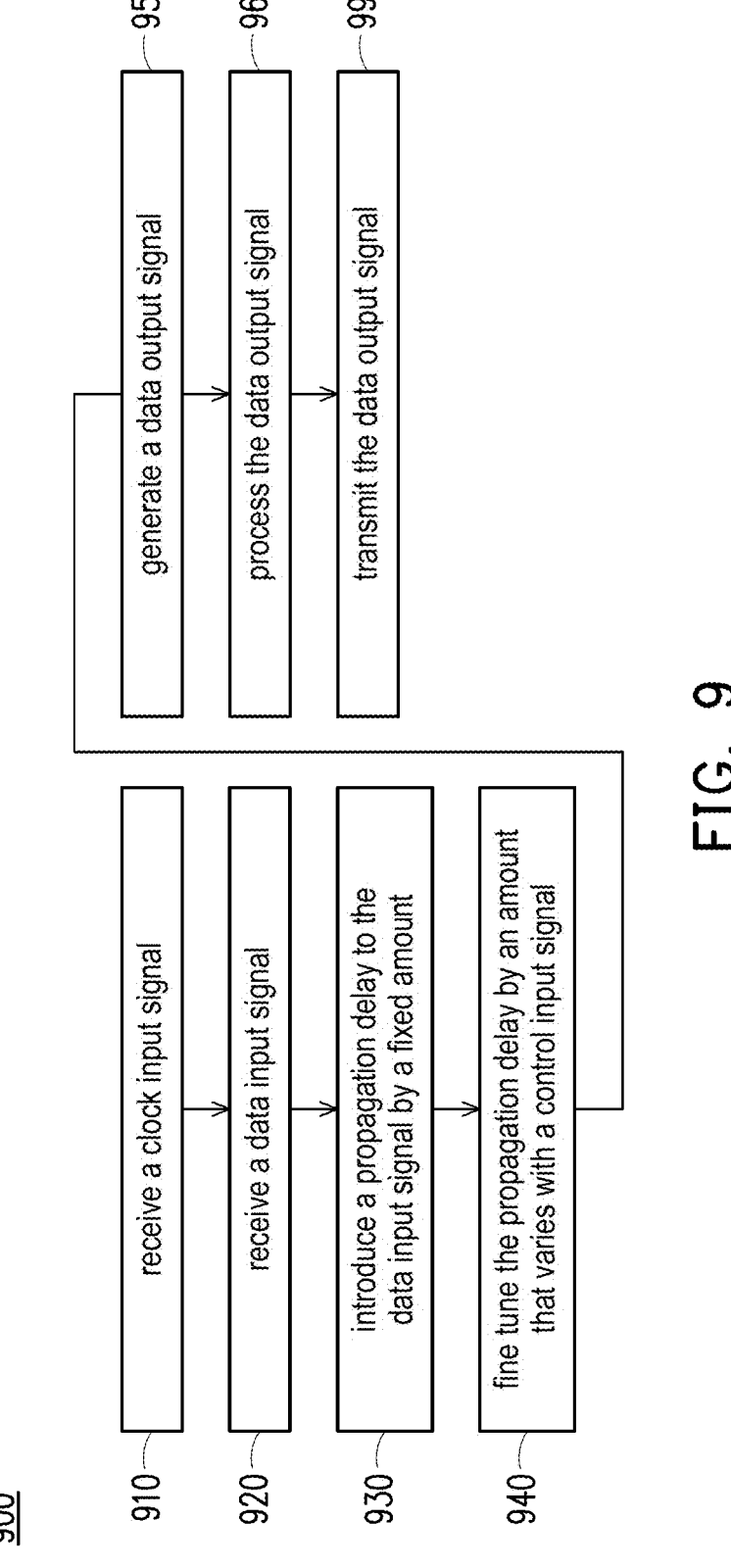
FIG. 9 is a flow chart of the fourth exemplary embodiment of a method for synchronizing a data input signal and a clock input signal in accordance with an embodiment of the present disclosure.

FIG. 9 is a flow chart of a further exemplary embodiment of a method 900 for aligning or synchronizing low and high portions of a data input signal to rising and falling edges of a clock input signal in accordance with the present disclosure. The example method 900 is described with further reference to FIGS. 1A, 1B, 2B, and 8 for ease of understanding. It is understood that the method 900 is applicable to structures other than those of FIGS. 1A, 1B, 2B, and 8. Further, it is understood that additional operations can be provided before, during, and after the method 900, and some of the operations described below can be replaced or eliminated, in an alternative embodiment of the method 900.

In operation 910, the clock tree 210 receives a clock input signal (clkin), e.g., from a clock signal-generating device external to the device 100, and generates a plurality of clock input signals (clkin[0]-clkin[n]). In this exemplary embodiment, the operation 910 includes: the amplifier 230 amplifying the clock input signal (clkin); the calibration circuit 240 adjusting the duty cycle of the amplified version of the clock input signal (clkin) and generating a clock input signal (clkin') that has a substantially 50% duty cycle; and the distribution network 250 generating a plurality of clock input signal (clkin[0]-clkin[n]) based on the clock input signal (clkin'). In an alternative embodiment, the operation 910 further includes the calibration circuit 240 minimizing or eliminating a phase error between a pair of clock input signals (clkin').

In operation 920, the amplifier 260 receives a data input signal (Din[0]), e.g., from a data signal-generating device external to the device 100, and generates an amplified version of the data input signal (Din[0]).

In operation 930, the first delay line 270a introduces a propagation delay to the amplified version of the data input signal (Din[0]) by a fixed or predetermined amount.

In operation 940, the second delay line 270b receives a control input signal (ctrlin) and fine tunes the propagation delay of the first delay line 270a by an amount that varies with the control input signal (ctrlin).

In operation 950, the data I/O circuit 280 receives the amplified version of the data input signal (Din[0]) and the clock input signal (clkin[0]) and generates, as a data output signal (Dout[0]), the high and low portions of the amplified data input signal (Din[0]) during the rising and falling edges of the clock input signal (clkin[0]). By virtue of the delay circuit 270, which substantially matches the propagation delay of the data input signal (Din[0]) with the propagation delay of the clock input signal (clkin[0]), the data I/O circuit 280 aligns the high and low portions of the data input signal (Din[0]) with the rising and falling edges of the clock input signal (clkin[0]) without a significant synchronization delay. That is, the data I/O circuit 280 generates the data output signal (Dout) such that the alignment or synchronization between the high and low portions of the data input signal (Din[0]) and the rising and falling edges of the clock input signal occurs at once when the data I/O circuit 280 receives the data input signal (Din[0]), i.e., from the first high or low portion of the data input signal (Din[0]).

In operation 960, the processing circuit 120 processes the data output signal (Dout[0]) and generates a data output signal (Dout'). In operation 970, the transmitting circuit 130 transmits the data output signal (Dout') to, e.g., a signal-receiving device external to the device 100.

Figure 10:
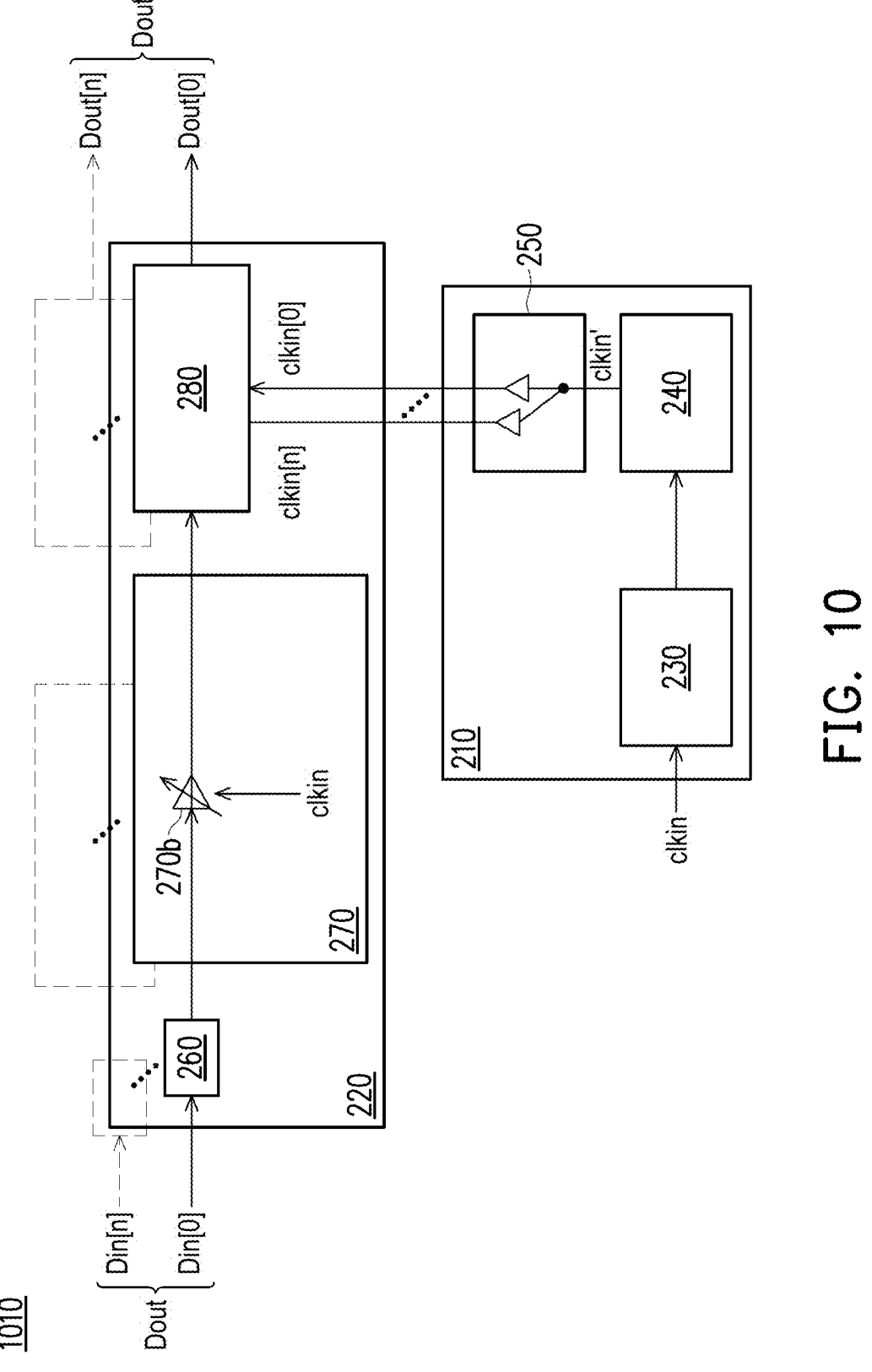
FIG. 10 is a block diagram of the fifth exemplary embodiment of a receiving circuit of the device in accordance with an embodiment of the present disclosure.

FIG. 10 is a block diagram of a further exemplary embodiment of a receiving circuit 1010 of the device 100 in accordance with the present disclosure. As illustrated in FIG. 10, the example receiving circuit 1010 differs from the example receiving circuit 110 of FIG. 2A in that the delay circuit 270 of at least one of the receivers 220 of the receiving circuit 1010 is implemented with the second delay line 270b and is dispensed with the first delay line 270a. The clock tree 210 is dispensed with the control signal-generating circuit 290. In this exemplary embodiment, the receiving circuit 1010 introduces a propagation delay to the amplified version of the data input signal (Din[0]) by an amount that varies with the control input signal (ctrlin). Unlike the receiving circuit 110, the receiving circuit 1010 does not introduce a fixed or predetermined amount of a propagation delay to the amplified version of the data input signal (Din[0]) and receives the control input signal (ctrlin) from a control signal-generating device external to the device 100.

Figure 11:
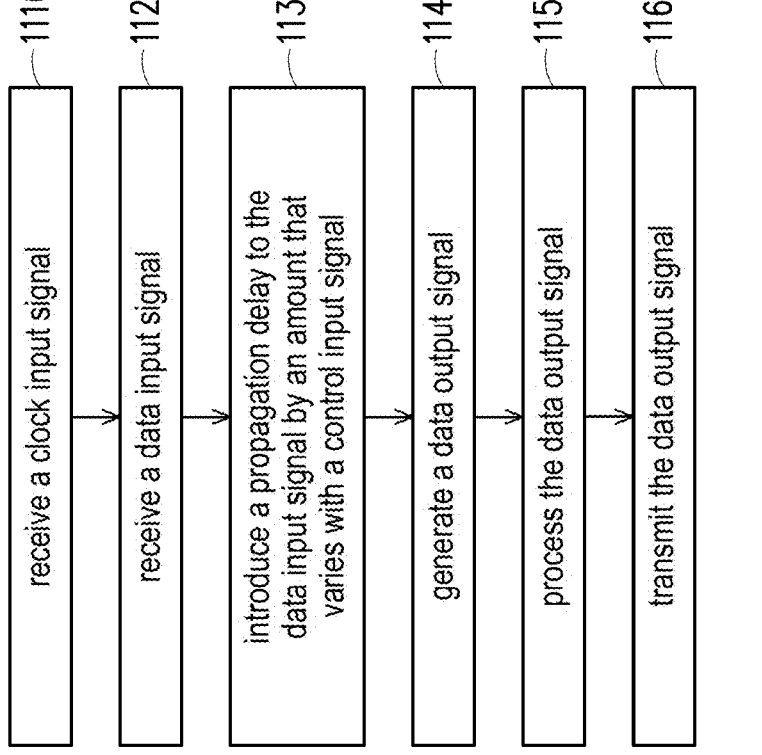
FIG. 11 is a flow chart of the fifth exemplary embodiment of a method for synchronizing a data input signal and a clock input signal in accordance with an embodiment of the present disclosure.

FIG. 11 is a flow chart of a further exemplary embodiment of a method 1100 for aligning or synchronizing low and high portions of a data input signal with rising and falling edges of a clock input signal in accordance with the present disclosure. The example method 1100 will now be described with further reference to FIGS. 1A, 1B, 2B, and 10 for ease of understanding. It is understood that the method 1100 is applicable to structures other than those of FIGS. 1A, 1B, 2B, and 10. Further, it is understood that additional operations can be provided before, during, and after the method 1100, and some of the operations described below can be replaced or eliminated, in an alternative embodiment of the method 1100.

In operation 1110, the clock tree 210 receives a clock input signal (clkin), e.g., from a clock signal-generating device external to the device 100, and generates a plurality of clock input signals (clkin[0]-clkin[n]). In this exemplary embodiment, the operation 1110 includes: the amplifier 230 amplifying the clock input signal (clkin); the calibration circuit 240 adjusting the duty cycle of the amplified version of the clock input signal (clkin) and generating a clock input signal (clkin') that has a substantially 50% duty cycle; and the distribution network 250 generating a plurality of clock input signals (clkin[0]-clkin[n]) based on the clock input signal (clkin'). In an alternative embodiment, the operation 1110 further includes the calibration circuit 240 minimizing or eliminating a phase error between a pair of clock input signals (clkin').

In operation 1120, the amplifier 260 receives a data input signal (Din[0]), e.g., from a data signal-generating device external to the device 100, and generates an amplified version of the data input signal (Din[0]).

In operation 1130, the second delay line 270b receives a control input signal (ctrlin) and introduces a propagation delay to the amplified version of the data input signal (Din[0]) by an amount that varies with the control input signal (ctrlin).

In operation 1140, the data I/O circuit 280 receives the amplified version of the data input signal (Din[0]) and the clock input signal (clkin[0]) and generates, as a data output signal (Dout[0]), the high and low portions of the amplified data input signal (Din[0]) at the rising and falling edges of the clock input signal (clkin[0]). By virtue of the delay circuit 270, which substantially matches the propagation delay of the data input signal (Din[0]) to the propagation delay of the clock input signal (clkin[0]), the data I/O circuit 280 aligns the high and low portions of the data input signal (Din[0]) to the rising and falling edges of the clock input signal (clkin[0]) without a significant synchronization delay. That is, the data I/O circuit 280 generates the data output signal (Dout) such that the alignment or synchronization between the high and low portions of the data input signal (Din[0]) and the rising and falling edges of the clock input signal occurs at once when the data I/O circuit 280 receives the data input signal (Din[0]), i.e., from the first high or low portion of the data input signal (Din[0]).

In operation 1150, the processing circuit 120 processes the data output signal (Dout[0]) and generates a data output signal (Dout'). In operation 1160, the transmitting circuit 130 transmits the data output signal (Dout') to, e.g., a data signal-receiving device external to the device 100.

Systems and methods as described herein include a number of examples. In one example, a device of the present disclosure includes a receiver that receives a data input signal and a clock input signal and that generates high and low portions of the data input signal during rising and falling edges of the clock input signal. The receiver includes a delay circuit that ensures the alignment between the high and low portions of the data input signal and the rising and falling edges of the clock input signal without a significant synchronization delay. The construction as such optimizes a performance, power, and area (PPA) of the device.

In an embodiment, a device comprises a receiving circuit, a processing circuit, and a transmitting circuit. The receiving circuit generates a clock input signal and includes a plurality of receivers, each of which receives a data input signal and generates a first data output signal. Each receiver includes a delay line that is devoid of a duty cycle corrector (DCC), that has a predetermined number of delay elements, and that introduces a propagation delay to the data input signal by a fixed amount that substantially matches a propagation delay of the clock input signal. The processing circuit processes the first data output signal and generates a second data output signal. The transmitting circuit transmits the second data output signal to a data signal-receiving device.

In another embodiment, a device comprises a receiving circuit, a processing circuit, and a transmitting circuit. The receiving circuit includes a receiver that receives a data input signal and that generates a clock input signal and a first data output signal. The receiver includes a delay line that receives a control input signal and that introduces a propagation delay to the data input signal by an amount that varies with the control input signal and that substantially matches a propagation delay of the clock input signal. The processing circuit processes the first data output signal and generates a second data output signal. The transmitting circuit transmits the second data output signal to a data signal-receiving device.

In another embodiment, a method, for synchronizing a data input signal and a clock input signal, comprises: receiving a clock input signal and a data input signal; introducing, by a first delay line a first propagation delay to the data input signal by a predetermined amount; fine tuning, by a second delay line, the first propagation delay; after introducing and fine tuning the first propagation delay, generating a first data output signal based on the data input signal; processing, by a processing circuit, the first data output signal and generating a second data output signal; and transmitting the second data output signal to a data signal-receiving device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a receiving circuit configured to generate a clock input signal, the receiving circuit including a plurality of receivers, each of which is configured to receive a data input signal and to generate a first data output signal, wherein each of the receivers includes a first delay line that is devoid of a duty cycle corrector (DCC), that has a predetermined number of delay elements, and that is configured to introduce a propagation delay to the data input signal by a fixed amount that matches a propagation delay of the clock input signal;
   a processing circuit configured to process the first data output signal and to generate a second data output signal; and
   a transmitting circuit configured to transmit the second data output signal to a data signal- receiving device.

2. The device of claim 1, wherein the first delay lines of at least two of the receivers have different numbers of delay elements.

3. The device of claim 1, further comprising a data input/output (I/O) circuit configured to receive the data input signal and the clock input signal and to generate high and low portions of the data input signal at rising and falling edges of the clock input signal.

4. The device of claim 1, further comprising a second delay line configured to fine tune the propagation delay of the first delay line.

5. The device of claim 4, wherein the second delay line is configured to receive a control input signal and to introduce a propagation delay by an amount that varies with the control input signal.

6. The device of claim 5, further comprising a clock tree including:

a calibration circuit configured to correct a duty cycle of a first clock input signal and to generate a second clock input signal that has a 50% duty cycle;

a distribution network configured to generate a plurality of third clock input signals based on the second clock input signal; and a control signal-generating circuit configured to generate the control input signal.

7. The device of claim 6, wherein the control signal-generating circuit includes:

a first delay line configured to introduce a propagation delay to the first clock input signal;

a second delay line configured to fine tune the propagation delay of the first delay line;

a phase detector configured to compare phases of the first and second clock input signals and to generate a phase difference based on a result of the comparison; and a controller configured to generate the control input signal based on the phase difference.

8. The device of claim 1, wherein matching the propagation delay of the data input signal to the propagation delay of the clock input signal is sufficient to ensure that a synchronization delay between the data input signal and the clock input signal is between 0.2 picoseconds and 1.2 picoseconds.

9. A device comprising:

a receiving circuit including a receiver configured to receive a data input signal and to generate a clock input signal and a first data output signal, wherein the receiver includes a delay line configured to receive a control input signal and to introduce a propagation delay to the data input signal by an amount that varies with the control input signal and that matches a propagation delay of the clock input signal;

a processing circuit configured to process the first data output signal and to generate a second data output signal; and a transmitting circuit configured to transmit the second data output signal to a data signal-receiving device.

10. The device of claim 9, further comprising a clock tree configured to receive a first clock input signal and to generate a second clock input signal, the clock tree including a control signal-generating circuit configured to generate the control input signal based on the first and second clock input signals.

11. The device of claim 10, wherein the control signal-generating circuit includes:

a phase detector configured to compare the data input signal and the clock input signal and to generate a phase difference based on a result of the comparison; and a controller configured to generate the control input signal based on the phase difference.

12. The device of claim 9, further comprising a clock tree including:

a calibration circuit configured to correct a duty cycle of a first clock input signal and to generate a second clock input signal that has 50% duty cycle; and a distribution network configured to generate a plurality of third clock input signals based on the second clock input signal.

13. The device of claim 9, further comprising a clock tree including:

a calibration circuit configured to correct a phase error between first and second clock input signals; and a distribution network configured to generate a plurality of third clock input signals based on the first and second clock input signals.

14. The device of claim 9, wherein matching the propagation delay of the data input signal to the propagation delay of the clock input signal allows synchronization between high and low portions of the data input signal and rising and falling edges of the clock input signal to commence upon a first high or low portion of the data input signal received by the receiving circuit.

15. A method for synchronizing a data input signal and a clock input signal, the method comprising:

receiving the data input signal and the clock input signal;

introducing, by a first delay line, a first propagation delay to the data input signal by a predetermined amount;

fine tuning, by a second delay line, the first propagation delay;

after introducing and fine tuning the first propagation delay, generating a first data output signal based on the data input signal;

processing, by a processing circuit, the first data output signal and generating a second data output signal; and transmitting the second data output signal to a data signal-receiving device.

16. The method of claim 15, wherein generating the first data output signal includes generating high and low portions of the data input signal during rising and falling edges of the clock input signal.

17. The method of claim 15, wherein fine tuning the first propagation delay includes receiving a control input signal and introducing a second propagation delay by an amount that varies with the control input signal.

18. The method of claim 15, further comprising:

correcting a duty cycle of a first clock input signal and generating a second clock input signal that has a 50% duty cycle; and generating a plurality of third clock input signals based on the second clock input signal.

19. The method of claim 15, further comprising:

correcting a phase error between first and second clock input signals; and generating a plurality of third clock input signals based on the first and second clock input signals.

20. The method of claim 15, wherein:

the data input signal is in a serial form; and generating the first data output signal includes converting the data input signal into a parallel form.

\* \* \* \* \*